(12) United States Patent
Watanabe

(10) Patent No.: US 6,225,658 B1
(45) Date of Patent: May 1, 2001

(54) SEMICONDUCTOR DEVICE MANUFACTURE METHOD AND SEMICONDUCTOR DEVICE COMPRISING CAPACITOR AND MISFET

(75) Inventor: Akiyoshi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/208,274

(22) Filed: Dec. 9, 1998

(30) Foreign Application Priority Data

Apr. 30, 1998 (JP) .................................................. 10-120951

(51) Int. Cl.$^7$ .......................... H01L 27/108; H01L 29/76; H01L 29/94; H01L 31/119; H01L 29/00

(52) U.S. Cl. .......................... 257/296; 257/295; 257/300; 257/532

(58) Field of Search ...................................... 257/296–310, 257/379–385, 338–339, 404, 532, 535; 438/238–243

(56) References Cited

U.S. PATENT DOCUMENTS

| 5,457,062 | * | 10/1995 | Keller et al. | 438/238 |
|---|---|---|---|---|
| 5,618,749 | * | 4/1997 | Takahashi et al. | 438/238 |
| 5,767,558 | * | 6/1998 | Lo et al. | 257/412 |
| 5,939,753 | * | 8/1999 | Ma et al. | 257/339 |

FOREIGN PATENT DOCUMENTS

| 6-61423 | 3/1994 | (JP) . |
|---|---|---|
| 6-318673 | 11/1994 | (JP) . |
| 8-97363 | 4/1996 | (JP) . |
| 8-274257 | 10/1996 | (JP) . |
| 9-36313 | 2/1997 | (JP) . |
| 9-82887 | 3/1997 | (JP) . |

* cited by examiner

Primary Examiner—Tom Thomas
Assistant Examiner—Cuong Q Nguyen
(74) Attorney, Agent, or Firm—Armstrong, Westerman, Hattori, McLeland & Naughton, LLP

(57) ABSTRACT

A gate insulating film is formed on the surface of active regions of a semiconductor substrate, and a first polysilicon film is deposited on the semiconductor substrate. Impurities are selectively doped into the first silicon film in an area where a capacitor is to be formed. A dielectric film is formed on the first silicon film. A second silicon film doped with impurities is formed on the dielectric film. The second silicon film and dielectric film are patterned so that the second silicon film and dielectric film are left in the area where the capacitor is to be formed, and not left in the area where MISFET are to be formed. A third silicon film is deposited on the whole surface of the substrate. A mask pattern covers the surface of the third silicon film in the area included by the patterned second silicon film as viewed along a direction normal to the substrate surface and in the area where a gate electrode of MISFET is to be formed, and the silicon films are selectively etched under the conditions that the dielectric film is not etched. A semiconductor device can be formed which has a low voltage dependency of a capacitor electrostatic capacitance and a small variation of electrostatic capacitances.

8 Claims, 11 Drawing Sheets ured with a resist pattern 107. By using the resist pattern as a mask, the silicon films are partially etched.

SEMICONDUCTOR DEVICE MANUFACTURE METHOD AND SEMICONDUCTOR DEVICE COMPRISING CAPACITOR AND MISFET

This application is based on Japanese Patent Application No. 10-120951 filed on Apr. 30, 1998, the entire contents of which are incorporated herein by reference.

BACKGROUND OF THE INVENTION a) Field of the Invention

The present invention relates to a semiconductor device manufacture method and a semiconductor device, and more particularly to a method of manufacturing a semiconductor device having capacitors and MISFETs and its manufacture method.

b) Description of the Related Art

A conventional method of manufacturing a semiconductor device having complementary MOS transistors (CMOS transistors) and capacitors will be described.

As shown in FIG. 11A, the surface of a p-type silicon substrate 100 has element isolation structures 101 to define active regions. One active region is located in an n-type well 102. A gate oxide film 103 is formed on the surface of the active region. An n-type high impurity concentration polysilicon film 104 is deposited on the gate oxide film 103.

As shown in FIG. 11B, an $SiO_2$ film is deposited on the n-type high impurity concentration polysilicon film 104, and partially etched to leave a capacitor dielectric film 105 on the element isolation structure 101.

As shown in FIG. 11C, another n-type high impurity concentration polysilicon film 106 is deposited on the n-type high impurity concentration polysilicon film 104, covering the capacitor dielectric film 105. On the surface of the n-type high impurity concentration polysilicon film 106, the area where a capacitor upper electrode is formed and the area where gate electrodes of a MISFET are formed, are covered with a resist pattern 107. By using the resist pattern as a mask, the silicon films are partially etched.

FIG. 11D shows the substrate after the silicon films were etched. In the area where the capacitor is formed, an upper electrode 106a of the n-type high impurity concentration polysilicon film 106 corresponding to the resist pattern 107 is left. A lower electrode 104a of the n-type high impurity concentration polysilicon film 104 is left under the capacitor dielectric film 105 which served as an etching mask. In the above manner, a capacitor 108 is formed including the lower electrode 104a, capacitor dielectric film 105, and upper electrode 106a.

In each active region, a gate electrode 107 is formed having a lamination structure of the n-type high impurity concentration polysilicon films 104 and 106.

As shown in FIG. 11E, p-type impurities are doped in both side regions of the gate electrode 107 in the n-type well 102 to form source/drain regions 109, whereas n-type impurities are doped in both side regions of the gate electrode 107 in the active region not formed with the n-type well 102 to form source/drain regions 110. In the above manner, a p-channel MISFET 111 is formed in the n-type well 102, and n-channel MISFET 112 is formed in a surface layer of the p-type silicon substrate 100.

If a natural silicon oxide film is formed at the interface between the n-type high impurity concentration polysilicon films 104 and 106, this natural silicon oxide film functions as an etching stopper layer during the process shown in FIG. 11C and the lower n-type high impurity concentration polysilicon film 104 is left unetched. In order to avoid this, prior to etching the n-type high impurity concentration polysilicon film 106, the surface of the n-type high impurity concentration polysilicon film 104 is cleaned with hydrofluoric acid containing etchant.

However, the surface of the capacitor dielectric film 105 is partially etched slightly during this cleaning, and its thickness changes. A change in the thickness of the capacitor dielectric film 105 results in a variation of capacitances of the capacitor.

In order to reduce a voltage dependency of the capacitance, it is preferable to increase the impurity concentration of the lower and upper electrodes 104a and 106a. In the conventional process of FIG. 11B, the capacitor lower electrode and the lower part of each gate electrode are deposited at the same time and n-type impurities are doped. Therefore, the gate electrodes 107 of the p- and n-channel MISFETs 111 and 112 both have n-type conductivity. It is therefore difficult to constitute a dual gate CMOS circuit having a p-type gate electrode of a p-channel MISFET and an n-type gate electrode of an n-channel MISFET.

The upper electrode 106a and an upper part of each gate electrode 107 are formed by the same process shown in FIG. 11C. Therefore, if the impurity concentration of the upper electrode 106a is made high, the impurity concentration of the upper part of the gate electrode 107 also becomes high. If the impurity concentration is high, silicification with metal becomes difficult.

It is also known that as the impurity concentration becomes high, crystal grains of silicon become large. If the crystal grains of a polysilicon film are large, channeling becomes likely to occur during ion implantation. Therefore, the gate electrode 107 becomes unsuitable for using as a mask when ions are implanted to form source/drain regions.

SUMMARY OF THE INVENTION

It is an object of the present invention to provide a method of manufacturing a semiconductor device having a low voltage dependency of capacitance of a capacitor and a small variation of capacitances.

According to one aspect of the present invention, there is provided a method of manufacturing a semiconductor device comprising: a first step of forming element isolation structures on a surface of a semiconductor substrate to define an active region where a MISFET is to be formed; a second step of forming a gate insulating film on a surface of the active region; a third step of depositing a first silicon film on the gate insulating film; a fourth step of selectively doping impurities into the first silicon film in an area where a capacitor is to be formed on the element separation structure, without doping the impurities into a region where a gate electrode of the first MISFET is to be formed; a fifth step of forming a first dielectric film on the first silicon film; a sixth step of a second silicon film on the first dielectric film, the second silicon film being doped with impurities and imparted with a conductivity; a seventh step of patterning the second silicon film and the first dielectric film to leave the second silicon film and the first dielectric film in the area where the capacitor is to be formed, without leaving the second silicon film and the first dielectric film in an area where the first MISFET is to be formed; an eighth step of depositing a third silicon film on the first silicon film and the patterned second silicon film; a ninth step of covering, with a first mask pattern, surfaces of the third silicon film in an area included by the patterned second silicon film as viewed along a direction normal to the semiconductor substrate, and in an area where the gate electrode of the first MISFET is to be formed; a tenth step of etching the third, second, and first silicon films to form a capacitor and a first gate electrode, by using the first mask pattern as a mask under a condition that a silicon film is selectively etched without etching the first dielectric film, the capacitor including a lower electrode made of the patterned first silicon film under the patterned first dielectric film, a capacitor dielectric film made of the patterned first dielectric film, an upper electrode lower layer part made of the second silicon film left in a partial area of the capacitor dielectric film, and an upper electrode upper layer part made of the patterned third silicon film on the upper electrode lower layer part, and the first gate electrode including the first and third silicon films left in the area where the first MISFET is to be formed; an eleventh step of removing the first mask pattern; and a twelfth step of doping impurities into the upper electrode upper layer part of the capacitor, the first and third silicon films of the first gate electrode, and source/drain regions on both sides of the first gate electrode.

Before the eighth step is performed, the second silicon film is disposed on the first dielectric film patterned at the seventh step. Therefore, even if a process of cleaning the substrate surface is executed before the third silicon film is deposited, it is possible to prevent the first dielectric film from being thinned. Accordingly, the capacitance of the capacitor can be suppressed from being varied.

According to another aspect of the present invention, there is provided a semiconductor device comprising: a semiconductor substrate; element isolation structure formed on a surface of the semiconductor substrate and defining active regions; a capacitor formed on the element isolation structure, the capacitor being a lamination of a lower electrode made of silicon, a capacitor dielectric film made of dielectric material, an upper electrode lower layer part made of silicon, and an upper electrode upper layer part made of silicon, respectively stacked in this order, an impurity concentration of the upper electrode lower layer part being higher than an impurity concentration of the upper electrode upper layer part; and MISFETs formed in the active regions, a gate electrode of each MISFET having a thickness generally equal to a total thickness of the lower electrode and the upper electrode upper layer part, and an impurity concentration of the gate electrode in a lower region having a thickness equal to the lower electrode being different from an impurity concentration of the lower electrode.

Since the upper electrode lower layer part has a relatively high impurity concentration, the voltage dependency of the capacitance of the capacitor can be made small. A difference between a height of the capacitor and a height of the gate electrode is about a total thickness of the capacitor dielectric film and the upper electrode lower layer part at a maximum. Therefore, a resist film thickness obtained by the photolithography process to be executed after the capacitor and gate electrodes are formed, can be made relatively uniform and high precision patterning becomes possible.

DETAILED DESCRIPTION OF THE PREFERRED EMBODIMENTS

Figure 1:
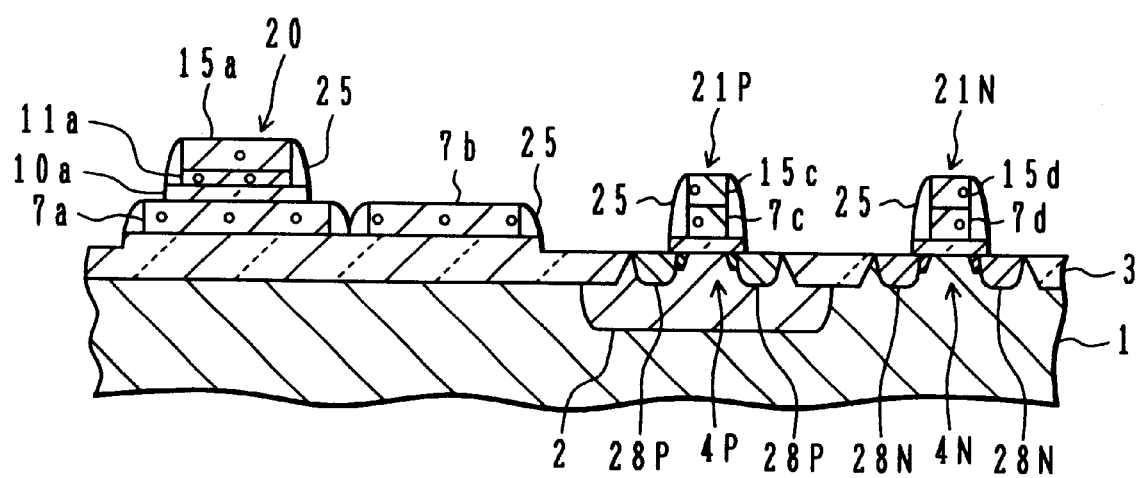
FIG. 1 is a cross sectional view of a semiconductor device according to a first embodiment of the invention.

FIG. 1 is a cross sectional view showing a semiconductor device according to the first embodiment of the invention. An n-type well 2 is formed in a partial region of a surface layer of a silicon substrate 1 in which boron (B) impurities are doped to impart a p-type conductivity. The impurity concentration is $2 \times 10^{15}$ cm$^{-3}$. For example, the n-type well 2 is formed by implanting phosphorous ions (P$^+$) under the conditions of an acceleration energy of 200 keV and a dose of $1.5 \times 10^{13}$ cm$^{-2}$.

On the surface of the silicon substrate 1, trench type element isolation structures 3 are formed to define active regions 4P and 4N. A p-channel MISFET (metal/insulator/semiconductor structure field effect transistor) including source/drain regions 28P and a gate electrode 21P is formed in the active region 4P. An n-channel MISFET including source/drain regions 28N and a gate electrode 21N is formed in the active region 4N.

A capacitor 20 and a resistor element 7b are disposed on the element isolation structure 3. The capacitor 20 is formed by sequentially laminating a lower electrode 7a, a capacitor dielectric film 10a, an upper electrode lower layer part 11a, and an upper electrode upper layer part 15a in this order. The lower electrode 7a, upper electrode lower layer part 11a, and upper electrode upper layer part 15a are made of an n-type polysilicon film.

A spacer insulating film 25 made of insulating material is formed on the side walls of the capacitor 20, resistor element 7b, and gate electrodes 21P and 21N.

The lower electrode 7a is made of a polysilicon film deposited by the same process as used for the resistor element 7b, a lower part 7c of the gate electrode 21P, and a lower part 7d of the gate electrode 21N. Therefore, these films have generally the same thickness. The upper electrode upper layer part 15a is made of a polysilicon film deposited by the same process as used for an upper part 15c of the gate electrode 21P and an upper part 15d of the gate electrode 21N. The gate electrodes 21P and 21N are not formed with a layer corresponding to the capacitor dielectric layer 10a and upper electrode lower layer part 11a of the capacitor 11a. Therefore, the thickness of each of the gate electrodes 21P and 21N is generally equal to the total thickness of the lower electrode 7a and upper electrode upper layer part 15a.

The lower electrode 7a and resistor element 7b have generally the same impurity concentration. The impurity concentrations of the lower layer part 7c of the gate electrode 21P and the lower layer part 7d of the gate electrode 21N are different from that of the lower electrode 7a.

A method of manufacturing the semiconductor device shown in FIG. 1 will be described hereinunder.

Figure 2A:
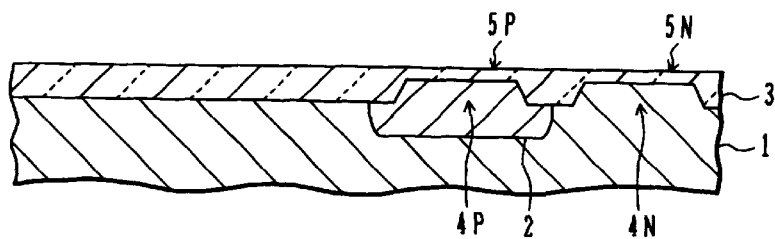
FIGS. 2A to 2E and FIGS. 3A to 3D are cross sectional views of a substrate illustrating a semiconductor device manufacturing method according to a first embodiment of the invention.

As shown in FIG. 2A, n-type impurities are doped in a partial region of the surface layer of a p-type silicon substrate 1 to form an n-type well 2. For example, the n-type impurities are doped by ion implantation. Shallow trench type element isolation structures 3 are formed on the surface of the silicon substrate, an active region 4P for forming a p-channel MISFET is defined in the surface layer of the n-type well 2, and an active region 4N for forming an n-channel MISFET is defined in the p-type region. The element isolation structure 3 may be formed through local oxidation of silicon (LOCOS). The silicon substrate 1 may be a substrate drawn by the Czochralski method, an epitaxial growth substrate, an SOI (silicon on insulator) substrate or the like.

The surfaces of the active regions 4P and 4N are thermally oxidized to form gate oxide films 5P and 5N on the surfaces of the active regions.

Figure 2B:
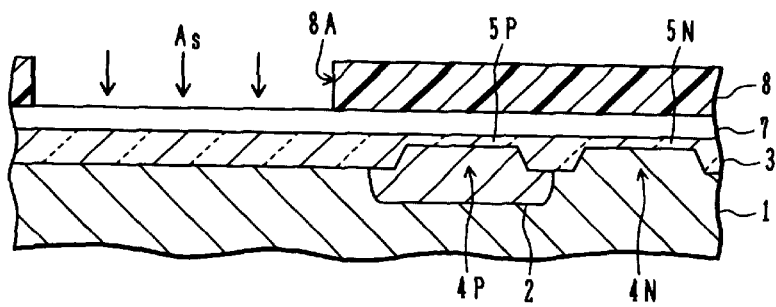

As shown in FIG. 2B, a non-doped first polysilicon film 7 is deposited to a thickness of about 150 nm on the element isolation structures 3 and gate oxide films 5P and 5N. For example, the first polysilicon film 7 is deposited through chemical vapor deposition (CVD) using $SiH_4$. An amorphous silicon film may be formed in place of the first polysilicon film 7. A resist pattern 8 is formed on the first polysilicon film 7, the resist pattern having an opening 8A corresponding to an area where the capacitor and resistor element are formed.

By using the resist pattern 8 as a mask, arsenic (As) ions are implanted under the conditions of an acceleration energy of 10 keV and a dose of $1\times10^{16}$ $cm^{-2}$. At this time, arsenic ions are not implanted into the first polysilicon film 7 above the active regions 4P and 4N. After the arsenic ion implantation, the resist pattern 8 is removed.

Figure 2C:
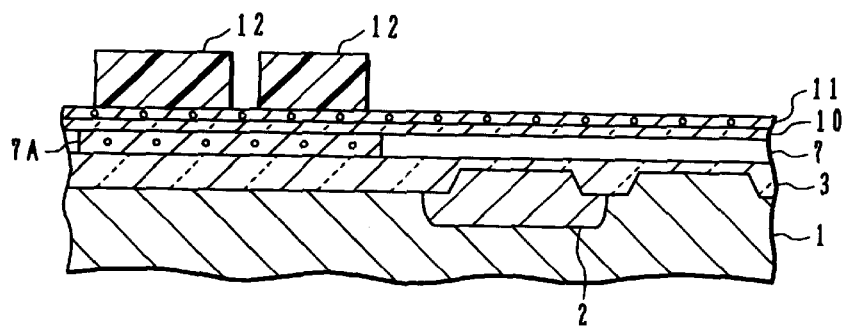

As shown in FIG. 2C, an n-type region 7A is therefore formed in the first polysilicon film 7 in an area corresponding to the opening 8A.

A first dielectric film 10 of $SiO_2$ is deposited on the first polysilicon film 7 to a thickness of about 20 nm. For example, the first dielectric film 10 is deposited by CVD using $SiH_4$ and $O_2$. The first dielectric film 10 may be a lamination film of SiN, $SiO_2$, and SiN, a TaO film or the like. The first dielectric film 10 may be formed by thermally oxidizing the surface layer of the first polysilicon film 7.

A second polysilicon film 11 is deposited on the first dielectric film 10 to a thickness of about 20 nm by CVD using $SiH_4$. When the second polysilicon film 11 is deposited, $PH_3$ is used as the n-type impurity source material, and the impurity concentration of the second polysilicon film 11 is set to $5\times10^{20}$ to $1\times10^{21}$ $cm^{-3}$. The second polysilicon film 11 may be formed by depositing a non-doped polysilicon film and thereafter doping impurities through vapor phase diffusion, ion implantation, or the like.

A resist pattern 12 corresponding to the capacitor lower electrode and resistor element is formed on the second polysilicon film 11. By using the resist pattern 12 as a mask, the second polysilicon film 11 and first dielectric film 10 are etched. For example, the second polysilicon film 11 is dry-etched by using $Cl_2O_2$, and the first dielectric film 10 is dry-etched by using $CF_4$. Wet etching may also be used. After the second polysilicon film 11 and first dielectric film 10 are etched, the resist pattern 12 is removed.

Figure 2D:
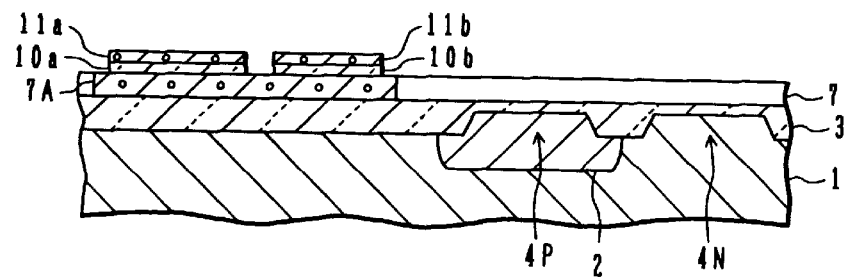

FIG. 2D shows the substrate after the resist pattern 12 was removed. The capacitor dielectric film 10a made of the first dielectric film 10 and the upper electrode lower layer part 11a made of the second polysilicon film 11 are therefore left in an area where the capacitor is formed. The patterned first dielectric film 10b and second polysilicon film 11b are also left in the area where the resistor element is formed. The first dielectric film 10 and second polysilicon film 11 are not left above the active regions 4P and 4N, and the first polysilicon film 7 is exposed.

Figure 2E:
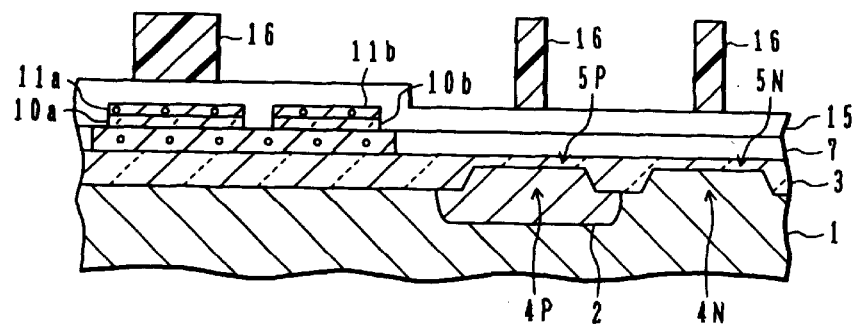

As shown in FIG. 2E, a non-doped third polysilicon film 15 is deposited on the first polysilicon film 7 to a thickness of about 150 nm, covering the upper electrode lower layer part 11a and patterned second polysilicon film 11b. Prior to depositing the third polysilicon film 15, the surface of the substrate is subjected to a wet process using hydrofluoric acid containing solution. During the period after the wet process and before the third polysilicon film 15 is deposited, the substrate is maintained not to be exposed in an oxidizing atmosphere, in order not to oxidize the surfaces of the first polysilicon film 7, upper electrode lower layer part 11a, and patterned second polysilicon film 11b.

During the wet process, it is possible to prevent the capacitor dielectric film 10a from being thinned, because the upper surface of the capacitor dielectric film 10a is covered with the second polysilicon film 11a.

A resist pattern 16 is formed on the surface of the third polysilicon film 15 in the area included in the upper electrode lower layer part 11a when viewed along a substrate normal direction and in the area where the gate electrodes of MISFETs in the active regions 4P and 4N are formed. At this time, the surface of the third polysilicon film 15 has a step corresponding to the total thickness of the capacitor dielectric film 10a and upper electrode lower layer part 11a. However, since this step is about 40 nm in height at a maximum and sufficiently low as compared to the thickness of a resist film to be coated, the resist film thickness can be made generally uniform. High precision photolithography is therefore possible.

By using the resist pattern 16 as a mask, the lamination structure from the third polysilicon film 15 to first polysilicon film 7 is etched. This etching is performed under the conditions that the silicon films are selectively etched without etching the capacitor dielectric film 10, first dielectric film 10b, and gate oxide films SP and SN made of $SiO_2$. For example, dry etching is performed under the low RF power conditions by using $Cl_2O_2$. After this etching, the resist pattern 16 is removed.

Figure 3A:
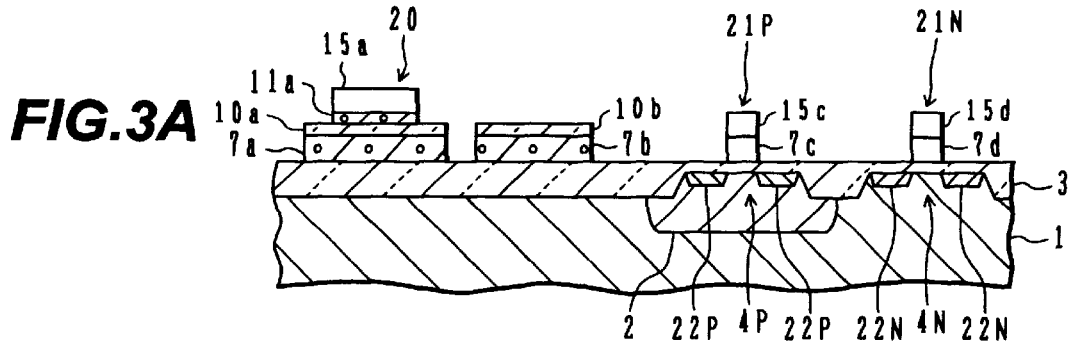

As shown in FIG. 3A, the capacitor 20 is therefore formed in the area where the capacitor is formed, the capacitor 20 having a lamination structure of the lower electrode 7a made of the first polysilicon film 7a, capacitor dielectric film 10a, upper electrode lower layer part 11a, and upper electrode upper layer part 15a made of the third polysilicon film 15. The lower electrode 7a of the capacitor 20 can be formed in a self alignment manner because the capacitor dielectric film 10a functions as an etching mask.

The resistor element 7b made of the first polysilicon film 7 is also left under the first dielectric film 10b in the area where the resistor element is formed. The gate electrode 21P is also left on the active region 4P, having the lamination structure of the patterned first polysilicon film 7c and third polysilicon film 15c, and the gate electrode 21N is also left on the active region 4N, having the lamination structure of the patterned first polysilicon film 7d and third polysilicon film 15d.

By using a resist pattern having an opening in an area corresponding to the active region 4P and the gate electrode 21P as masks, boron difluoride ions ($BF_2^+$) are implanted under the conditions of an acceleration energy of 20 keV and a dose of $1\times10^{13}$ $cm^{-2}$. A p-type region 22P for a lightly doped drain (LDD) structure is therefore formed in the regions on both sides of the gate electrode 21P in the surface layer of the n-type well 2.

Next, by using a resist pattern having an opening in an area corresponding to the active region 4N and the gate electrode 21N as masks, phosphorous ions (P$^+$) are implanted under the conditions of an acceleration energy of 20 keV and a dose of $4 \times 10^{13}$ cm$^{-2}$. An n-type region 22N for the LDD structure is therefore formed in the regions on both sides of the gate electrode 21N in the surface layer of the silicon substrate.

Figure 3B:
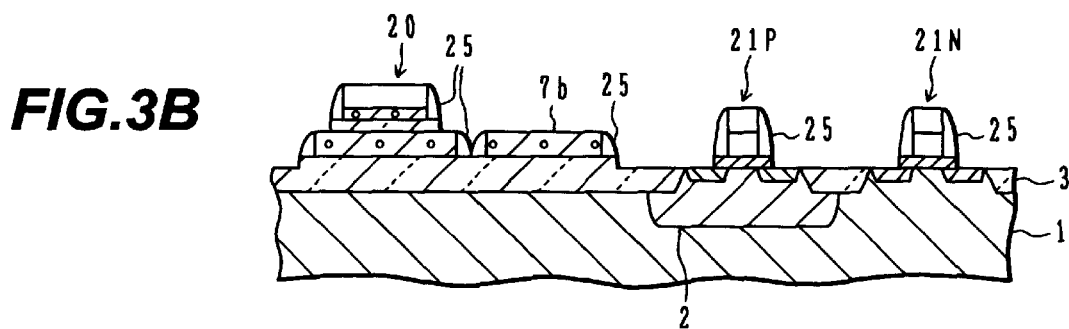

As shown in FIG. 3B, a spacer insulating film 25 of SiO$_2$ is formed on the side walls of the capacitor 20, resistor element 7b, and gate electrodes 21P and 21N. The spacer insulating film 25 is formed by depositing an SiO$_2$ film over the substrate whole surface by CVD and anisotropically etching the SiO$_2$ film. At this time, the first dielectric film 10b left on the resistor element 7b is also etched and the upper surface of the resistor element 7b is exposed.

Figure 3C:
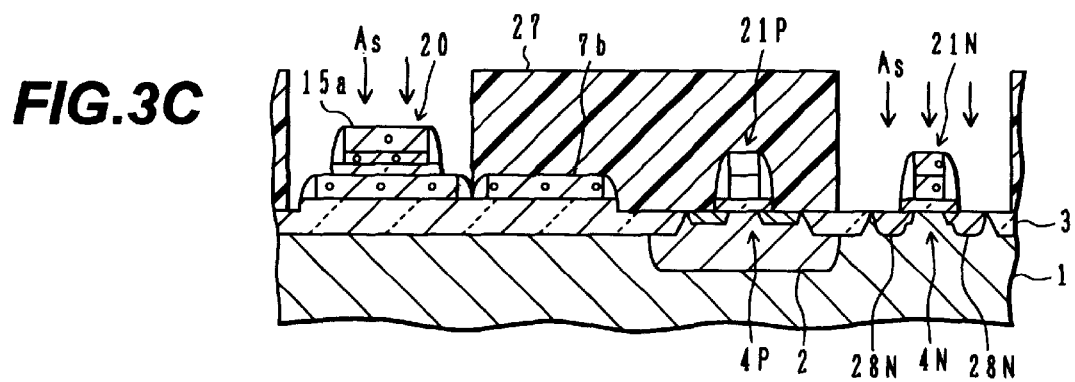

As shown in FIG. 3C, a resist pattern 27 is deposited to cover the resistor element 7b and active region 4P. By using the resist pattern 27 as a mask, arsenic ions (As$^+$) are implanted under the conditions of an acceleration energy of 30 keV and a dose of $1 \times 10^{15}$ cm$^{-2}$. After the ion implantation, the resist pattern 27 is removed. Arsenic ions are therefore implanted into the gate electrode 21N in the active region 4N and into the substrate surface layers on both sides of the gate electrode 21N. The gate electrode 21N is therefore imparted with the n-type conductivity and the n-type source/drain regions 28N having the LDD structure are formed on both sides of the gate electrode 21N.

Arsenic ions are also implanted into the upper electrode 15a of the capacitor 20 to impart the n-type conductivity.

Figure 3D:
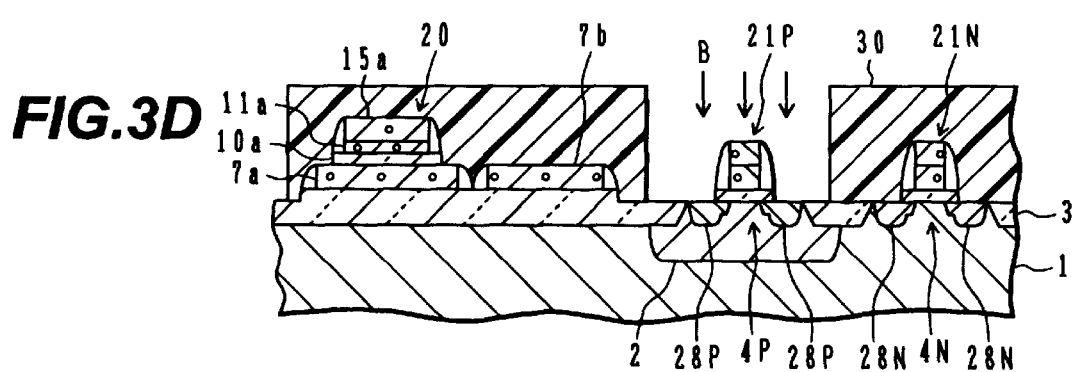

As shown FIG. 3D, a resist pattern 30 is deposited to cover the capacitor 20, resistor element 7b and active region 4N. By using the resist pattern 30 as a mask, BF$_2{}^+$ ions are implanted under the conditions of an acceleration energy of 20 keV and a dose of $3 \times 10^{15}$ cm$^{-2}$. After the ion implantation, the resist pattern 30 is removed. Boron ions are therefore implanted into the gate electrode 21P in the active region 4P and into the substrate surface layers on both sides of the gate electrode 21P. The gate electrode 21P is therefore imparted with the p-type conductivity and the p-type source/drain regions 28P having the LDD structure are formed on both sides of the gate electrode 21P.

In the above manner, a p-channel MISFET is formed in the active region 4P, having the gate electrode 21P and source/drain regions 28P, whereas an n-channel MISFET is formed in the active region 4N, having the gate electrode 21N and source/drain regions 28N. Since the gate electrode 21P of the p-channel MISFET is imparted with the p-type conductivity and the gate electrode 21N of the n-channel MISFET is imparted with the n-type conductivity, a dual gate type CMOS circuit can be formed.

In the first embodiment described above, during the wet process with hydrofluoric acid containing solution before the third polysilicon film 15 is deposited, the capacitor dielectric film 10a is protected by the upper electrode lower layer part 11a so that the capacitor dielectric film 10a will not be thinned. It is therefore possible to suppress a variation of capacitances to be caused by a change in thickness of the capacitor dielectric film 10a.

Impurity ions are implanted into the lower electrode 7a of the capacitor 20 during the ion implantation process shown in FIG. 2B independently from the ion implantation process for the gate electrode of MISFET. Although impurity ions are implanted into the upper electrode lower layer part 11a while the second polysilicon film 11 shown in FIG. 2C is deposited, this second polysilicon film 11 does not constitute the gate electrode of MISFET. Therefore, impurity ions can be implanted at a concentration suitable for the capacitor without being restricted by the impurity implantation conditions for the gate electrode of MISFET.

For example, it is required to raise the impurity concentration of the capacitor upper and lower electrodes in order to reduce the voltage dependency of the capacitance. If the impurity concentration of the gate electrode is raised, the diameter of crystal grains increases and the channeling effects are made strong while ions are doped into the source/drain regions. The breakdown voltage of the gate insulating film is also lowered.

Impurity ions are doped into the upper electrode upper layer part 15a of the capacitor 20 at the same time when ions are implanted into the gate electrode 21N of MISFET during the process shown in FIG. 3C. However, the voltage dependency of the capacitance of the capacitor 20 is not hardly affected by the impurity concentration of the upper electrode upper layer part 15a although it is affected by the impurity concentration near at the interface to the capacitor dielectric film 10a.

As the thickness of the capacitor dielectric film 10a becomes 10 nm or thinner, it becomes difficult to set the voltage dependency of the capacitance to 500 ppm/V or lower, even if impurity ions are doped into the upper and lower electrodes up to an impurity concentration near a solid solution limit. In addition, it is not preferable from the viewpoint of breakdown voltage to make the capacitor dielectric film 10a too thin. Conversely, it is a disadvantage to make the capacitor dielectric film 10a thick from the viewpoint of device integration. It is therefore preferable to set the thickness of the capacitor dielectric film 10a to 10 to 50 nm.

A difference between the height of the capacitor 20 and the height of each of the gate electrodes 21P and 21N is, as shown in FIG. 3D, only 40 nm which is a sum of the thickness of 20 nm of the capacitor dielectric film 10a and the thickness of 20 nm of the upper electrode lower layer part 11a. It is therefore possible to avoid any inconvenience when a contact hole is formed through an interlayer insulating film covering the capacitor 20.

Next, with reference to FIGS. 4A to 4C and FIGS. 5A to 5C, the semiconductor device manufacture method of the second embodiment will be described.

Figure 4A:
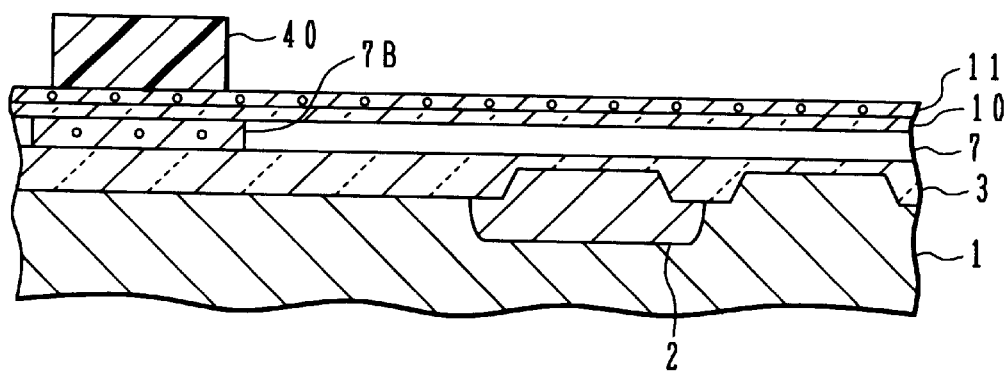
FIGS. 4A to 4C and FIGS. 5A to 5C are cross sectional views of a substrate illustrating a semiconductor device manufacturing method according to a second embodiment of the invention.

The processes up to the process shown in FIG. 4A will be described in comparison with those of the first embodiment. In the first embodiment, in the process shown in FIG. 2B, arsenic ions are implanted into the first polysilicon film 7 in the area where the lower electrode of the capacitor is formed and in the area where the resistor element is formed. In the second embodiment, ions are implanted into the first polysilicon 7 only in the area where the lower electrode of the capacitor is formed. Therefore, an n-type region 7B is formed in the first polysilicon film 7 in the area where the lower electrode of the capacitor is formed.

The first dielectric film 10 and second polysilicon film 11 of the first embodiment shown in FIG. 2C are deposited in this order on the first polysilicon film 7. In the first embodiment, in the process shown in FIG. 2C, the resist pattern 12 is deposited covering the area where the lower electrode of the capacitor is formed and the area where the resistor element is formed. In the second embodiment, a resist pattern 40 is deposited on the surface of the second polysilicon film 11 only in the area where the capacitor is formed.

By using the resist pattern 40 as a mask, the second polysilicon film 11 and first dielectric film 10 are etched.

Figure 4B:
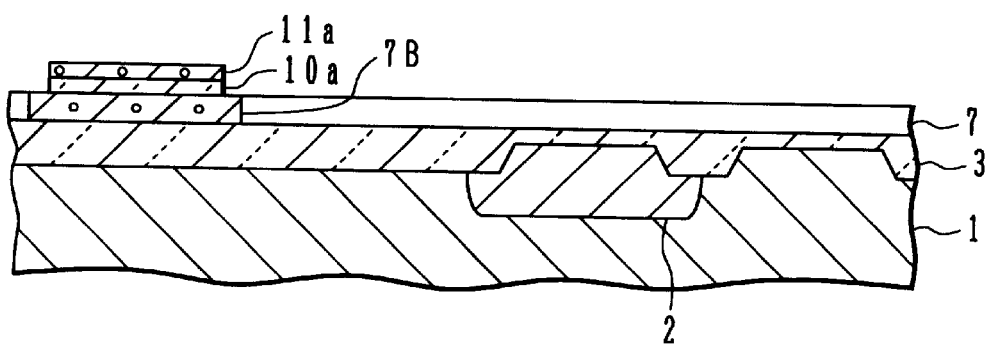

As shown in FIG. 4B, a lamination structure is therefore left having the capacitor dielectric film 10*a* on the n-type region 7B and the upper electrode lower layer part 11*a* made of the second polysilicon film 11.

Figure 4C:
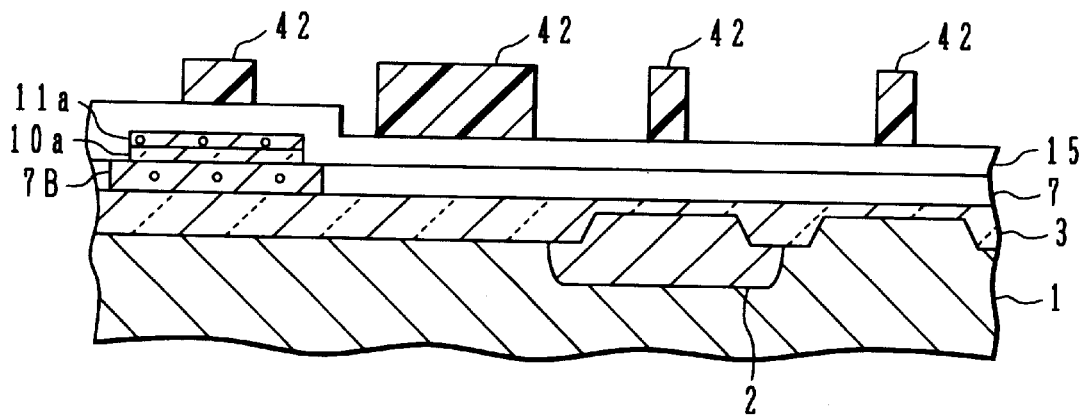

As shown in FIG. 4C, a third polysilicon film 15 is deposited on the second polysilicon film 7, covering the upper electrode lower layer part 11*a*. The third polysilicon film 15 is deposited by the same method as used for depositing the third polysilicon film 15 of the first embodiment shown in FIG. 2E.

In the first embodiment, in the process shown in FIG. 2E, the resist pattern 16 is deposited covering the surface of the third polysilicon film 15 in the area corresponding to the upper electrode of the capacitor and the gate electrode of MISFET. In the second embodiment, in addition to these areas, the area where the resistor element is formed is covered with a resist pattern 42.

By using the resist pattern 42 as a mask, the third polysilicon film 15, upper electrode lower layer part 11*a*, and second polysilicon film 7 are etched. After this etching, the resist pattern 42 is removed.

Figure 5A:
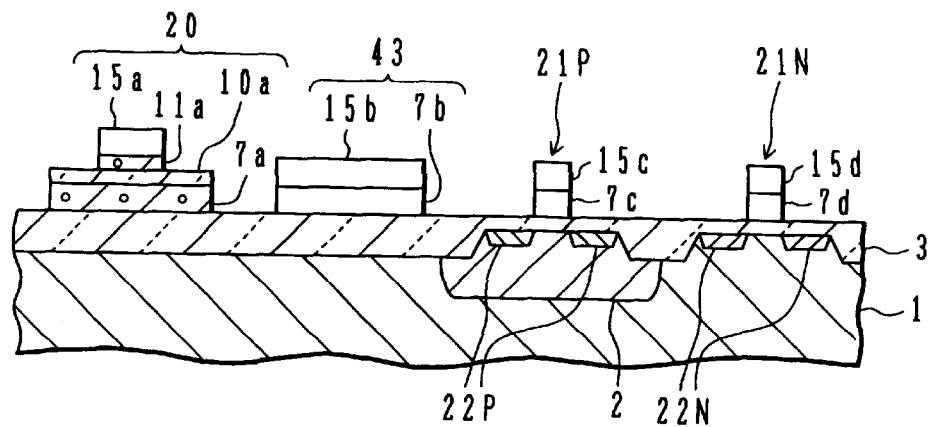

As shown in FIG. 5A, the capacitor 20 and gate electrodes 21P and 21N having the same structure as that of the first embodiment shown in FIG. 3A are therefore formed. The resistor element 7*b* formed in the first embodiment is constituted of one layer of the first polysilicon film 7, whereas a resistor element 43 formed in the second embodiment has a two-layer structure of patterned first polysilicon film 7*b* and third polysilicon film 15*b*. LDD regions 22P and 22N are formed by the same methods as the first embodiment.

Figure 5B:
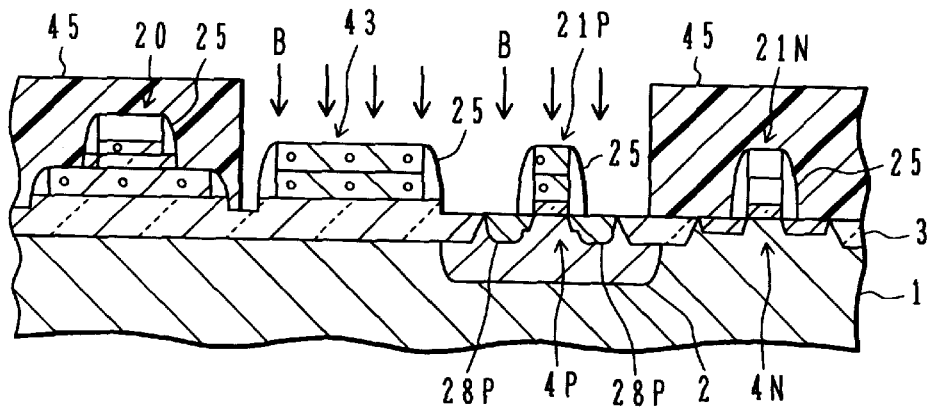

As shown in FIG. 5B, a spacer insulating film 25 is formed on the side walls of the capacitor 20, resistor element 43, and gate electrodes 21P and 21N. The capacitor 20 and active region 4N are covered with a resist pattern 45, and B ions are implanted. The ion implantation conditions are the same as those of the process of the first embodiment shown in FIG. 3D. After the ion implantation, the resist pattern 45 is removed. Therefore, the p-type conductivity is imparted to the gate electrode 21P, and source/drain regions 28P of the LDD structure are formed on both sides of the gate electrode. The p-type conductivity is also imparted to the resistor element 43.

Figure 5C:
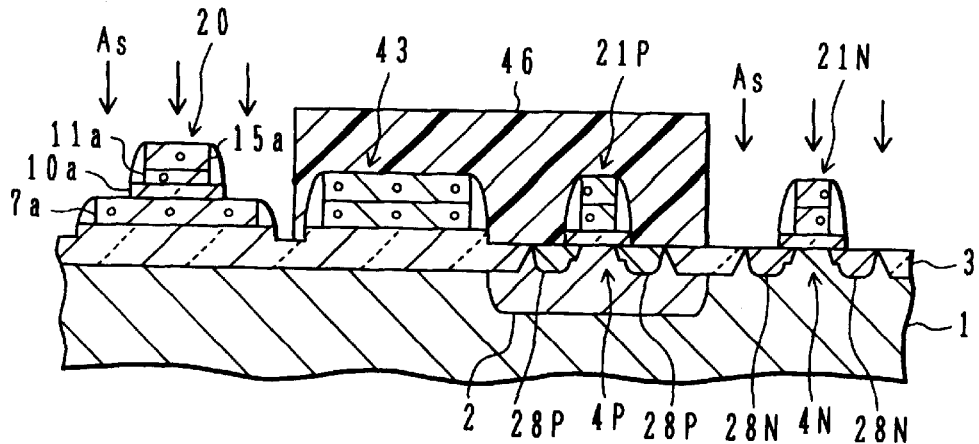

As shown in FIG. 5C, the resistor element 43 and active region 4P are covered with a resist pattern 46, and arsenic ions are implanted. The ion implantation conditions are the same as those of the process of the first embodiment shown in FIG. 3C. After the ion implantation, the resist pattern 46 is removed. Therefore, the n-type conductivity is imparted to the gate electrode 21N, and source/drain regions 28N of the LDD structure are formed on both sides of the gate electrode. The n-type conductivity is also imparted to the upper electrode upper layer part 15*a* of the capacitor 20.

Differences of the second embodiment from the first embodiment are the following two points. First, the resistor element 43 has a two-layer structure of the first polysilicon film 7*b* and third polysilicon film 15*b*. Second, impurity ions are implanted into the resistor element 7*b* at the same time as the ion implantation for forming the source/drain regions 28P in the active region 4P.

In the first embodiment, in the process shown in FIG. 2C, ions are implanted at the same time into the lower electrode of the capacitor and the resistor element. Ions may be implanted into the resistor element at the same time when another ion implantation process suitable for the impurity concentration of the resistor element is performed.

In the first and second embodiments, the case is not taken into consideration wherein a low resistance metal silicide film is formed in a self alignment manner on the surfaces of the source/drain regions and gate electrode. For example, in the state shown in FIG. 1 of the first embodiment or in the state after the resist pattern 46 of the second embodiment shown in FIG. 5C is removed, if the exposed surfaces of the source/drain regions 28P and 28N and gate electrodes 21P and 21N are silicified, a metal silicide film is formed also on the surface of the resistor element 7*b* or 43. If a low resistance metal silicide film is formed, it becomes difficult to obtain a desired resistance value. The third to fifth embodiments to be described in the following can utilize a self alignment silicide (salicide) process.

Figure 6A:
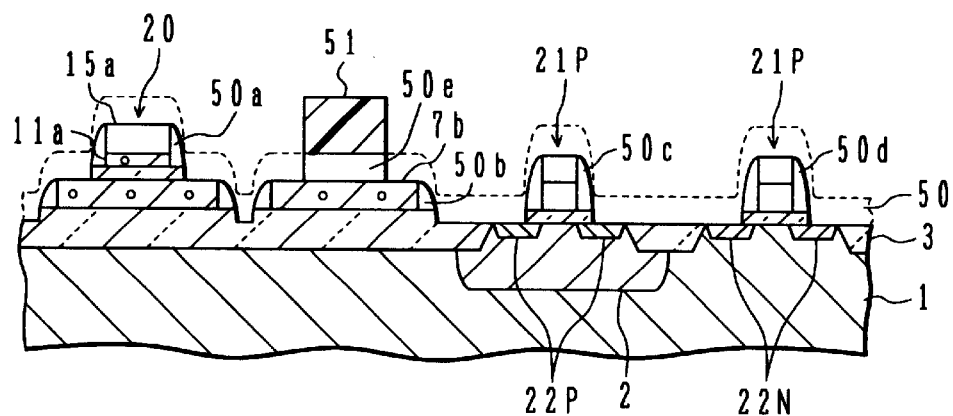
FIGS. 6A to 6C are cross sectional views of a substrate illustrating a semiconductor device manufacturing method according to a third embodiment of the invention.
Figure 6B:
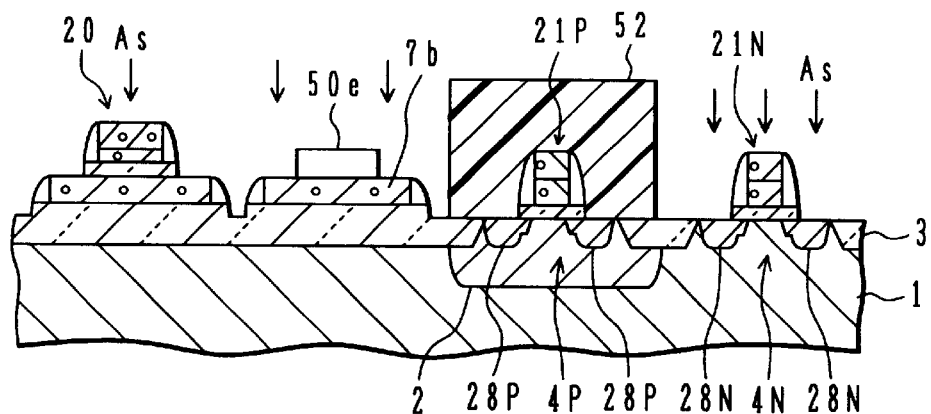
Figure 6C:
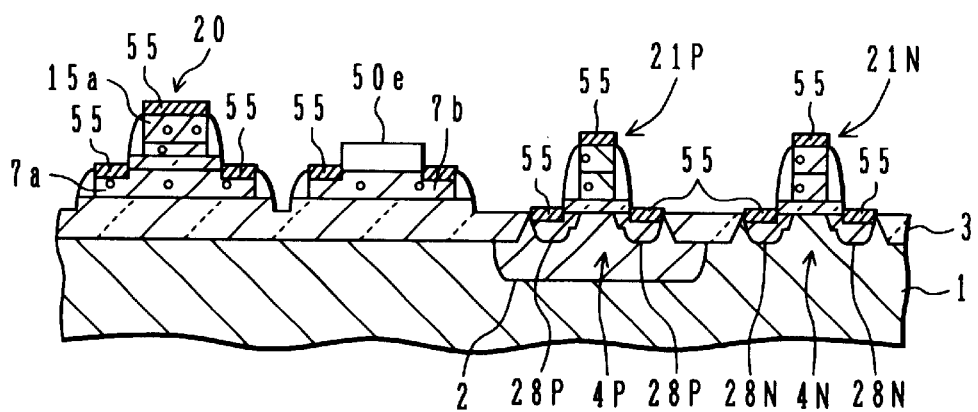

With reference to FIGS. 6A to 6C, the third embodiment will be described. A capacitor 20, a resistor element 7*b*, and gate electrodes 21P and 21N are formed by processes similar to those up to FIG. 3A of the first embodiment.

As shown in FIG. 6A, the whole surface of the substrate is covered with an $SiO_2$ film 50. A resist pattern 51 is formed on the surface of the $SiO_2$ film in an area corresponding to an area other than two separated electrode lead areas of the resistor element 7*b*, for example, in an area corresponding to an area other than two areas near the ends of the resistor element 7*b*. By using the resist pattern 51 as a mask, the $SiO_2$ film 50 is anisotropically etched. Spacer insulating films 50*a*, 50*b*, 50*c*, and 50*d* are therefore left on the side walls of the capacitor 20, resistor element 7*b*, and gate electrodes 21P and 21N, respectively, similar to the spacer insulating film 25 of the first embodiment shown in FIG. 3B. An $SiO_2$ pattern 50*e* is also left under the resist pattern 51. After the anisotropic etching, the resist pattern 51 is removed.

As shown in FIG. 6B, an ion implantation process similar to the process of the first embodiment shown in FIG. 3D is performed to form source/drain regions 28P in the active region 4P.

Next, the active region 4P is covered with a resist pattern 52, and arsenic ions are implanted. The ion implantation conditions are the same as those of the first embodiment shown in FIG. 3C. After the ion implantation process, the resist pattern 52 is removed. Arsenic ions are implanted into electrode lead areas of the resistor element 7*b* not covered with the $SiO_2$ pattern 50*e*, so that these electrode lead areas have a low resistance.

As shown in FIG. 6C, a metal silicide film 55 is formed on the exposed surfaces of the lower electrode 7*a*, upper electrode upper layer part 15*a*, resistor element 7*b*, source/drain regions 28P and 28N, and gate electrodes 21P and 21N. The metal silicide film 55 is formed by depositing a metal film made of metal capable of forming a silicide compound with silicon, such as Ti and Co, and by heating the substrate to allow a suicide reaction between the metal film and underlying silicon region. After the silicide reaction, an unreacted metal film is removed.

Of the surface of the resistor element 7*b*, an area other than the electrode lead areas is covered with the $SiO_2$ pattern. It is therefore possible to prevent the whole surface of the resistor element 7*b* from being silicified and to prevent the resistance value from being lowered.

Figure 7A:
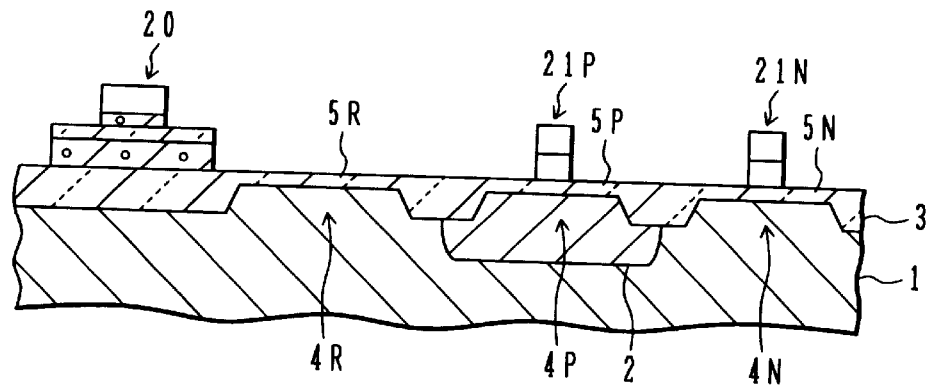
FIGS. 7A to 7C and FIGS. 8A to 8C are cross sectional views of a substrate illustrating a semiconductor device manufacturing method according to a fourth embodiment of the invention.

Next, with reference to FIGS. 7A to 7C and FIGS. 8A to 8C, the fourth embodiment will be described. As shown in FIG. 7A, a capacitor 20 and gate electrodes 21P and 21N are formed by processes similar to those up to FIG. 3A of the first embodiment. In the first embodiment, although the resistor element 7b is formed on the element isolation structure 3, in the fourth embodiment, an active region 4R is defined in the area where the resistor element is to be formed. On the surface of the active region 4R, a thin $SiO_2$ film 5R is formed at the same time the gate insulating films 5P and 5N are formed.

Figure 7B:
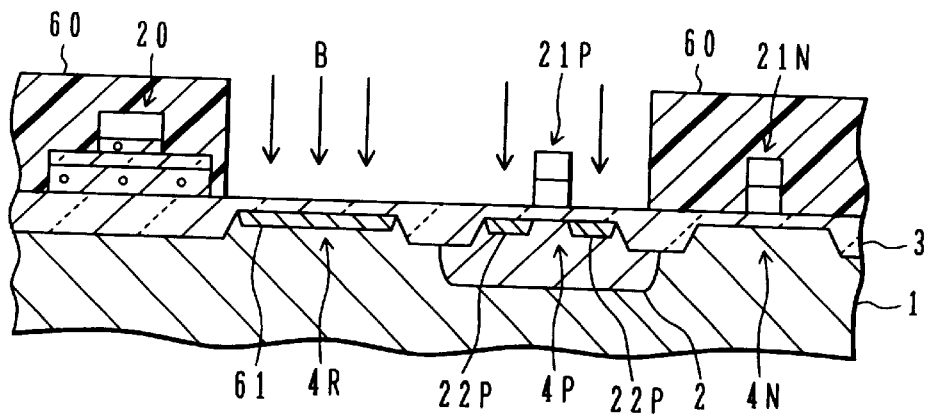

As shown in FIG. 7B, the capacitor 20 and active region 4N are covered with a resist pattern 60. By using the resist pattern 60, $BF_2^+$ ions are implanted under the conditions of an acceleration energy of 10 to 50 keV and a dose of $1\times10^{13}$ $cm^{-2}$. After the ion implantation, the resist pattern 60 is removed. With this ion implantation, n-type LDD regions 22P are formed in the active region 4P.

A p-type resistor element 61 is also formed in the surface layer of the active region 4R. The sheet resistance of the resistor element 61 formed under the above-described ion implantation conditions is about 1 kΩ. Since the resistor element having a relatively high resistance can be formed, the area of the region in the substrate occupied by the resistor element can be made small. The resistor element 61 is influenced by the bias potential applied to the-p-type silicon substrate 1. If this influence by the substrate bias potential poses an operation problem, the resistor element 61 may be formed in the n-type well.

Figure 7C:
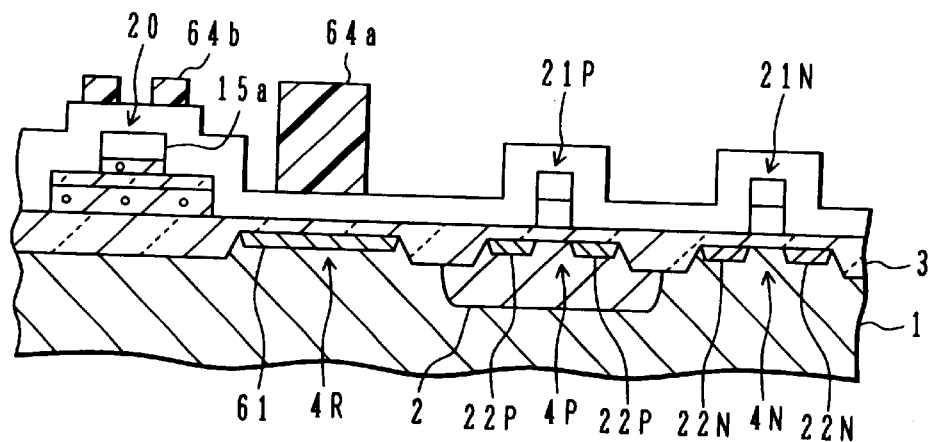

As shown in FIG. 7C, LDD regions 22N are formed in the active region 4N by the same method as used for the n-type LDD regions 22N of the first embodiment shown in FIG. 3A. An $SiO_2$ film 63 is deposited on the whole substrate surface to a thickness of 200 nm. Of the surface of the $SiO_2$ film 63, areas above the areas other than electrode lead regions of the resistor element 61 are covered with a resist pattern 64a, and an area corresponding to the circumference of the upper electrode upper layer part 15a of the capacitor 20 is covered with a resist pattern 64b. For example, if electrode leads are connected to end regions of the resistor element, the area corresponding to the area other than the regions near the end regions is covered with the resist pattern 64a.

By using the resist patterns 64a and 64b as masks, the $SiO_2$ film 63 is anisotropically etched. After the anisotropic etching, the resist patterns 64a and 64b are removed.

Figure 8A:
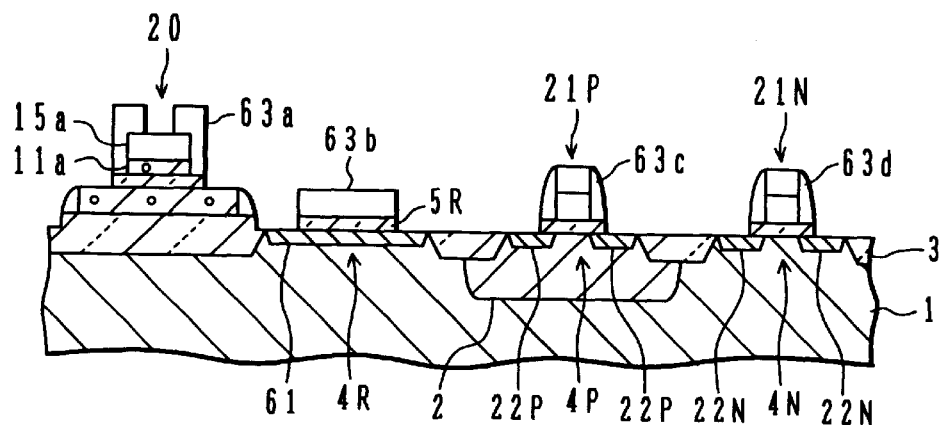

As shown in FIG. 8A, a spacer insulating film 63a is therefore left on the side wall of the capacitor 20 and on the area near the circumference of the upper surface of the upper electrodes 15a and 11a of the capacitor 20. An $SiO_2$ pattern 63b is also left on the area corresponding to the area other than the electrode lead regions. The thin $SiO_2$ film 5R formed at the same time when the gate insulating film was formed is left under the $SiO_2$ pattern 63b. Spacer insulating films 63c and 63d are also left on the respective side walls of the gate electrodes 21P and 21N.

Figure 8B:
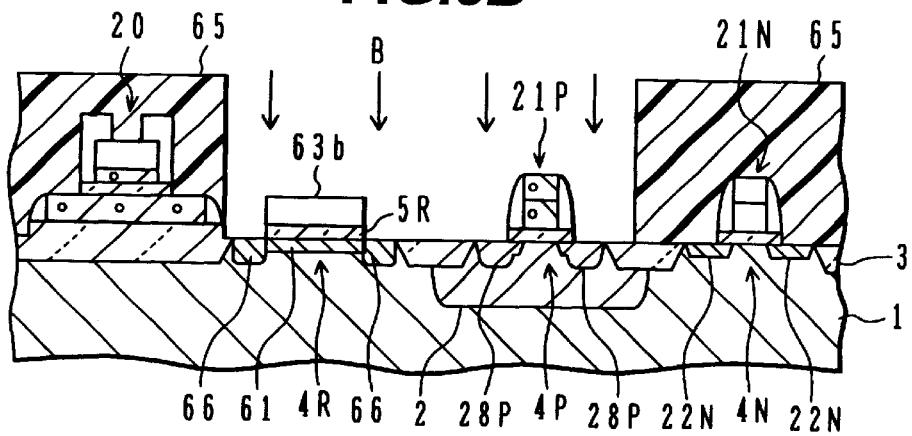

As shown in FIG. 8B, a resist pattern 65 is formed covering the capacitor 20 and active region 4N. By using the resist pattern 65 as a mask, boron (B) ions are implanted. The ion implantation conditions are the same as those used for implanting boron ions in the first embodiment shown in FIG. 3D. After the ion implantation, the resist pattern 65 is removed.

In the active region 4P, p-type source/drain regions 28P are therefore formed and the gate electrode 21P is imparted with the p-type conductivity. The electrode lead regions near the opposite ends of the resistor element 61 are also formed with p-type high impurity concentration regions 66.

Figure 8C:
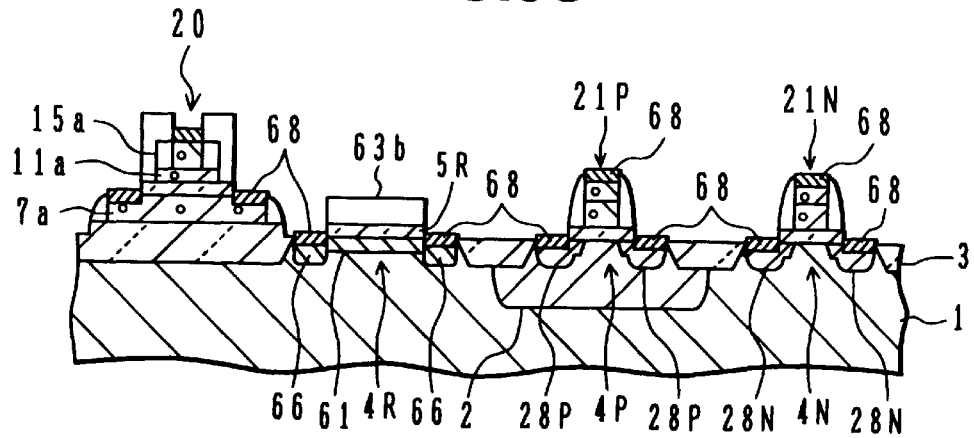

As shown in FIG. 8C, ions are implanted similar to the process of the first embodiment shown in FIG. 3C. In the active region 4N, n-type source/drain regions 28N are therefore formed, and the gate electrode 21N is imparted with the n-type conductivity. The area of the upper electrode upper layer part 15a of the capacitor 20 not covered with the spacer insulating film 63a is also imparted with the n-type conductivity.

A metal silicide film 68 is formed on the exposed surfaces of the lower electrode 7a and upper electrode upper layer part 15a of the capacitor 20, the p-type high impurity concentration regions 66 being near the ends of the resistor element 61, source/drain regions 28P and 28N, and gate electrodes 21P and 21N. The metal silicide film 68 is formed by the same method as used for forming the metal silicide film 55 of the third embodiment shown in FIG. 6C.

Also in the fourth embodiment, similar to the third embodiment, since parts of the surface of the resistor element 61 are covered with the $SiO_2$ pattern 63b, the metal silicide film will not be formed on the whole surface of the resistor element 61 and the resistance value of the resistor element 61 is prevented from being lowered.

In the third embodiment, as shown in FIG. 6A, the spacer insulating film 50a is formed on the side walls of the upper electrodes 15a and 11a of the capacitor 20 in a self alignment manner without using the etching mask. The thickness of each of the gate electrodes 21P and 21N is about 300 nm, and the total thickness of the upper electrodes 15a and 11a of the capacitor 20 is about 170 nm. Since the total thickness of the upper electrodes 15a and 11a of the capacitor 20 is about a half of the thickness of each of the gate electrodes 21P and 21N, the spacer insulating film 50a formed on the side walls of the upper electrodes 15a and 11a of the capacitor 20 becomes smaller than each of the spacer insulating films 50c and 50d formed on the side walls of the gate electrodes 21P and 21N.

In the fourth embodiment, as shown in FIGS. 7C and 8A, the spacer insulating film 63a is formed by using the resist pattern 64b. Therefore, the spacer insulating film 63a having a desired size can be formed independently from the total thickness of the upper electrodes 15a and 11a of the capacitor 20. It is therefore possible that in the silicification process shown in FIG. 8C, a short circuit, between the metal silicide film 68 formed on the upper surface of the lower electrode 7a and the metal silicide film 68 formed on the upper surface of the upper electrode upper layer 15a, can be avoided with good reproductivity.

Figure 9A:
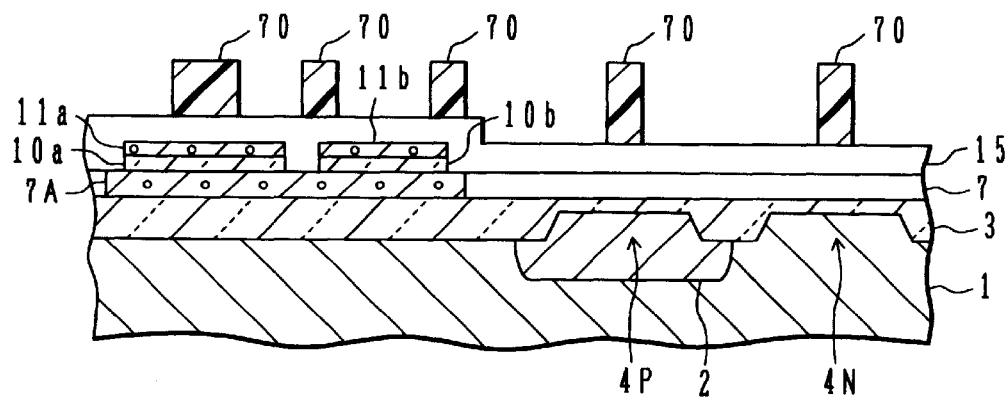
FIGS. 9A to 9C and FIGS. 10A to 10C are cross sectional views of a substrate illustrating a semiconductor device manufacturing method according to a fifth embodiment of the invention.

Next, with reference to FIGS. 9A to 9C and FIGS. 10A to 10C, the fifth embodiment will be described. As shown in FIG. 9A, a lamination structure up to the third polysilicon film 15 is formed on the surface of the silicon substrate 1 by the processes up to the process shown in FIG. 2E of the first embodiment. In the first embodiment, the resist pattern 16 covers the surface of the third polysilicon film 15 in the area above the capacitor dielectric film 11a and the areas corresponding to the MISFET gate electrodes in the active regions 4P and 4N. In addition to these areas, in the fifth embodiment, a resist pattern 70 covers the areas above areas near the ends of the first dielectric film 10b.

By using the resist pattern 70 as a mask, the lamination structure from the third polysilicon film 15 to the first polysilicon film 7 is etched. This etching is performed by the same method as used in the etching process described with reference to FIG. 2E. After this etching, the resist pattern 70 is removed.

Figure 9B:
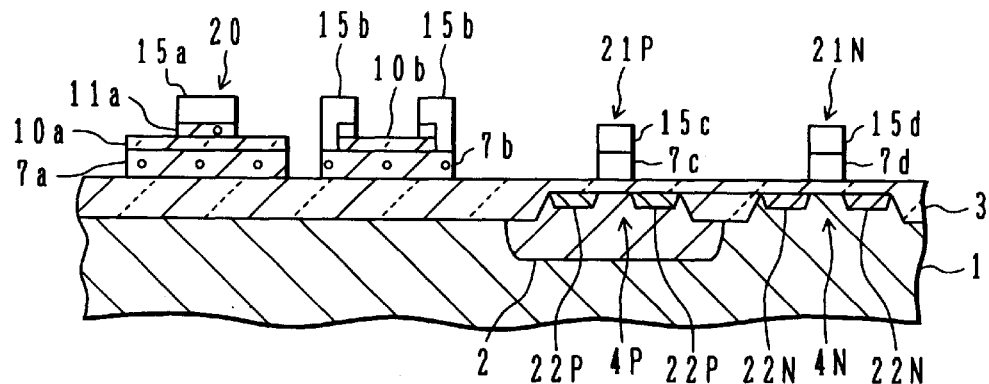

As shown in FIG. 9B, the capacitor 20, resistor element 7b, and gate electrodes 21P and 21N are therefore formed, similar to those shown in FIG. 3A. However, in this case, the resistor element 7b has a shape slightly protruding laterally from the opposite ends of the first dielectric film 10b. A polysilicon region 15b made of the third polysilicon film 15 is left on the protruded regions of the resistor element 7b. Portions of the second polysilicon film 11b are also left on the areas near opposite ends of the first dielectric film 10b.

Similar to FIG. 3A, LDD regions 22P and 22N are formed in the active regions 4P and 4N.

Figure 9C:
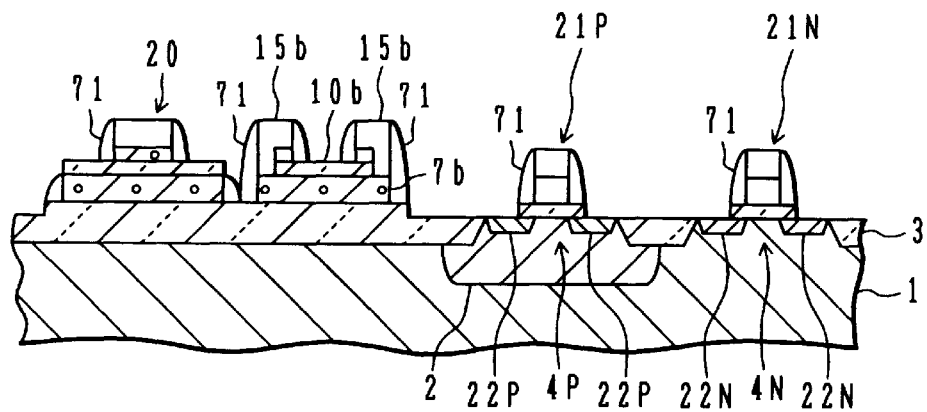

As shown in FIG. 9C, a spacer insulating film 71 of $SiO_2$ is formed on the side walls of the capacitor 20, gate electrodes 21P and 21N, polysilicon regions 15b, and resistor element 7b. In the first embodiment, since the spacer insulating film 25 is made of the same material as the first dielectric film 10b shown in FIG. 3A, the upper surface of the resistor element 7b is exposed when the spacer insulating film 25 is formed. In the fifth embodiment, the first dielectric film 10b on the resistor element 7b is made of SiN, and the spacer insulating film 71 is made of $SiO_2$. The anisotropic etching for forming the spacer insulating film 71 is performed under the conditions of a large etching selection ratio of $SiO_2$ relative to SiN, so that the first dielectric film 10b can be left on the upper surface of the resistor element 7b.

Figure 10A:
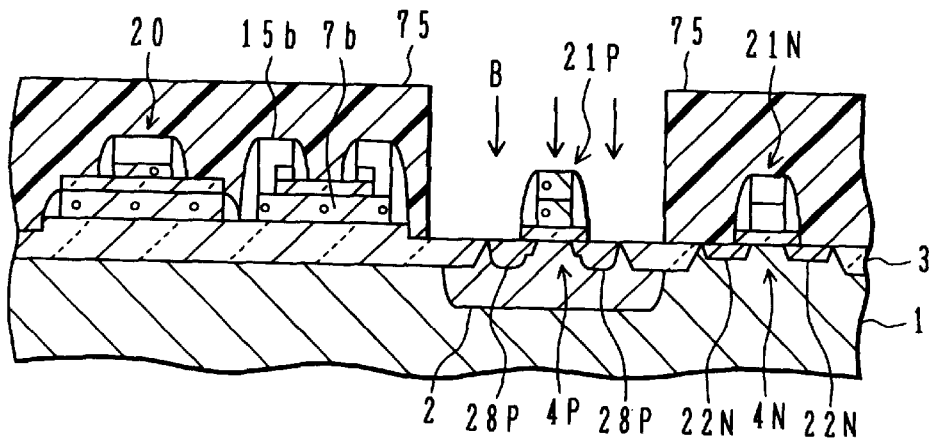

As shown in FIG. 10A, a resist pattern 75 is formed covering the active region 4N and the area where the capacitor 20 and resistor element 7b are formed. By using the resist pattern 75 as a mask, boron ions are implanted to form source/drain regions 28P in the active region 4P. The ion implantation conditions are the same as those of the boron ion implantation process of the first embodiment shown in FIG. 3D.

Figure 10B:
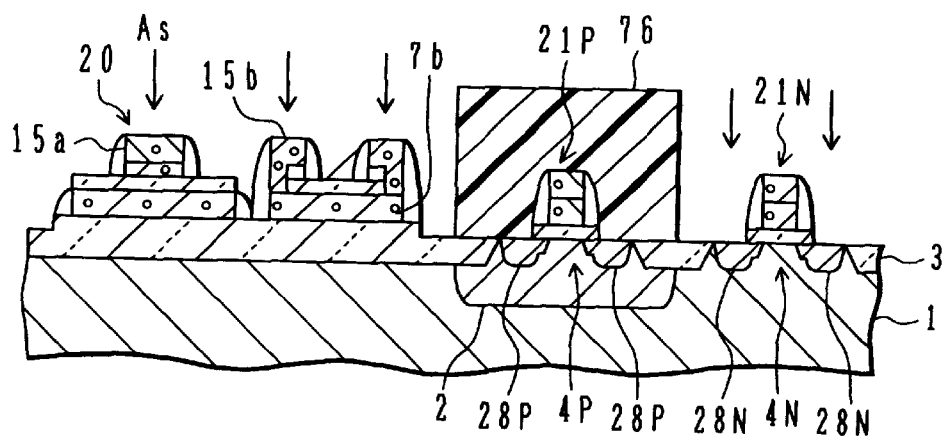

As shown in FIG. 10B, the active region 4P is covered with a resist pattern 76. By using the resist pattern 76 as a mask, arsenic ions are implanted. The ion implantation conditions are the same as those of the arsenic ion implantation process of the first embodiment shown in FIG. 3C. Similar to those shown in FIG. 3C, source/drain regions 28N are therefore formed in the active region 4N, and the n-type conductivity is imparted to the upper electrode upper layer part 15a of the capacitor 20 and the gate electrode 21N. The n-type conductivity is also imparted to the polysilicon regions 15b.

Figure 10C:
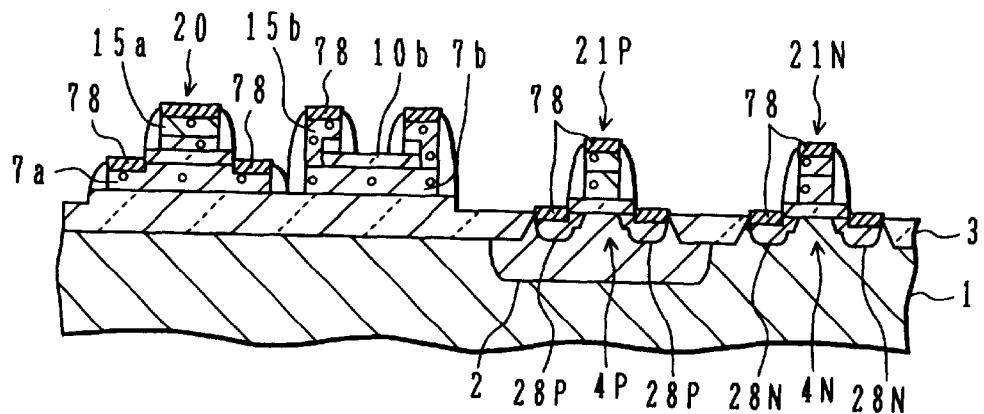
Figure 11A:
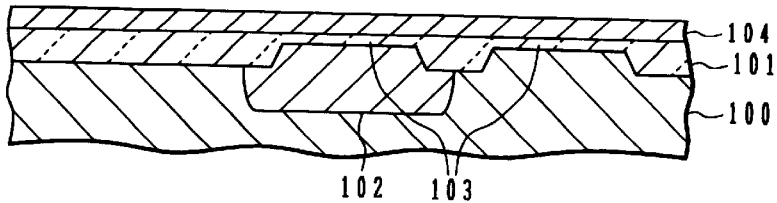
FIGS. 11A to 11E are cross sectional views of a substrate illustrating a conventional semiconductor device manufacturing method.
Figure 11B:
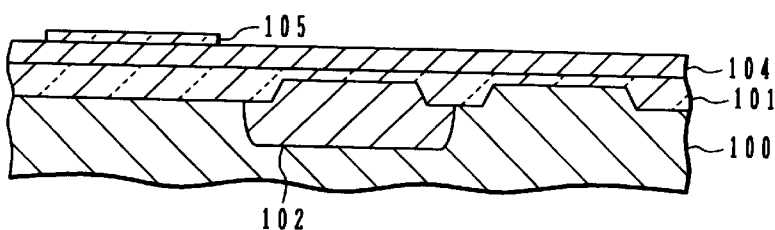
Figure 11C:
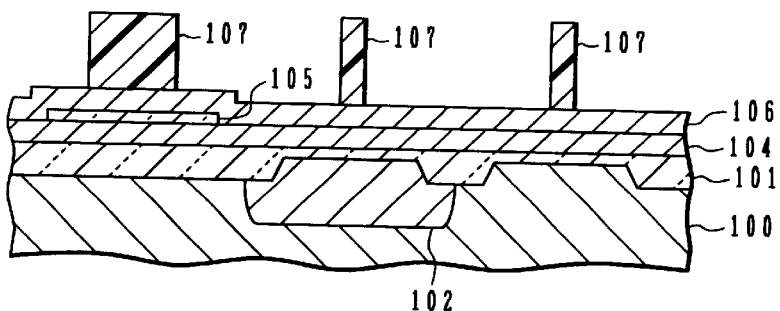
Figure 11D:
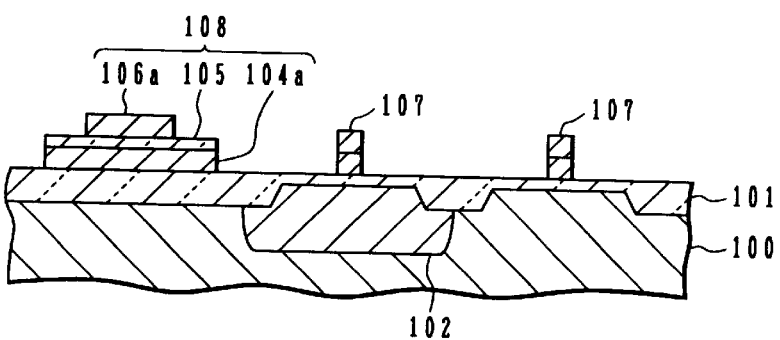
Figure 11E:
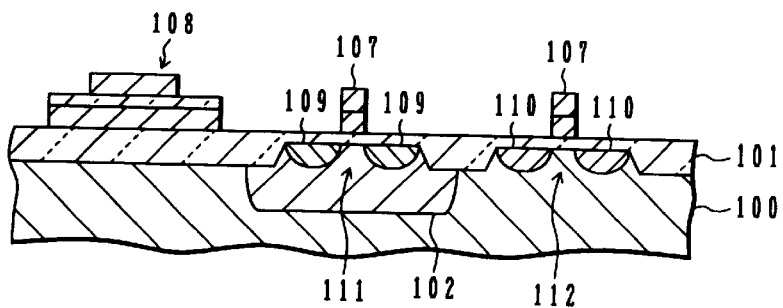

As shown in FIG. 10C, a metal silicide film 78 is formed on the exposed surfaces of the lower electrode 7a and upper electrode upper layer part 15a of the capacitor 20, polysilicon regions 15b, source/drain regions 28P and 28N, and gate electrodes 21P and 21N. The metal silicide film 78 is formed by the same method as used for forming the metal silicide film 55 of the third embodiment shown in FIG. 6C.

Since the surface of the resistor element 7b is covered with the first dielectric film 10b of SiN, it is possible to prevent the metal silicide film from covering the whole surface of the resistor element 7b and to prevent the resistance value of the resistor element 7b from being lowered.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
a semiconductor substrate;
element isolation structure formed on a surface of the semiconductor substrate and defining active regions;
a capacitor formed on the element isolation structure, the capacitor being a lamination of a lower electrode made of silicon, a capacitor dielectric film made of dielectric material, an upper electrode lower layer part made of silicon, and an upper electrode upper layer part made of silicon, respectively stacked in this order, an impurity concentration of the upper electrode lower layer part being higher than an impurity concentration of the upper electrode upper layer part; and
MISFETs formed in the active regions, a gate electrode of each MISFET having a thickness generally equal to a total thickness of the lower electrode and the upper electrode upper layer part, and an impurity concentration of the gate electrode in a lower region having a thickness equal to the lower electrode being different from an impurity concentration of the lower electrode.

2. A semiconductor device according to claim 1, further comprising a resistor element disposed on the element isolation structure, the resistor element being made of a silicon film having a thickness generally equal to the thickness of the lower electrode.

3. A semiconductor device according to claim 2, wherein an impurity concentration of the resistor element is equal to the impurity concentration of the lower electrode.

4. A semiconductor device according to claim 2, further comprising:
a first dielectric film formed on an upper surface of the resistor element in an area other than separated two electrode lead areas;
electrode lead portions made of silicon and disposed on the electrode lead areas; and
a spacer insulating film made of insulating material and formed on side walls of the electrode lead portions, the insulating material having an etching resistance different from the first dielectric film.

5. A semiconductor device according to claim 4, wherein an impurity concentration of the electrode lead portions is equal to an impurity concentration of the gate electrode of the MISFET.

6. A semiconductor device according to claim 4, further comprising metal silicide films covering an upper surface of said upper electrode upper layer part, an area of an upper surface of said lower electrode that is not covered with said capacitor dielectric film, upper surfaces of said electrode load portions, and upper surfaces of said gate electrodes and source/drain regions of said MISFETs.

7. A semiconductor device according to claim 1, further comprising a resistor element disposed on the element isolation structure, the resistor element being made of a silicon film having a thickness generally equal to a total thickness of the lower electrode and the upper electrode upper layer part.

8. A semiconductor device according to claim 7, wherein an impurity concentration of the resistor element is equal to an impurity concentration of the gate electrode of the MISFET.

* * * * *